United States Patent
Hagenauer et al.

[11] Patent Number: 5,761,248
[45] Date of Patent: Jun. 2, 1998

[54] METHOD AND ARRANGEMENT FOR DETERMINING AN ADAPTIVE ABORT CRITERION IN ITERATIVE DECODING OF MULTI-DIMENSIONALLY CODED INFORMATION

[75] Inventors: Joachim Hagenauer, Seefeld; Frank Burkert, Munich, both of Germany

[73] Assignee: Siemens Aktiengesellschaft, Munich, Germany

[21] Appl. No.: 684,155

[22] Filed: Jul. 19, 1996

[30] Foreign Application Priority Data

Jul. 19, 1995 [DE] Germany .................. 195 26 416.9

[51] Int. Cl.⁶ .................. G06F 11/10; H04L 1/00
[52] U.S. Cl. .................. 375/340; 371/43.1
[58] Field of Search .................. 375/265, 340; 371/43.1, 43.2, 43.3, 43.4

[56] References Cited

U.S. PATENT DOCUMENTS

| | | | |
|---|---|---|---|
| 3,938,085 | 2/1976 | Battail | 371/43.1 |
| 5,446,747 | 8/1995 | Berrou | 371/45 |

FOREIGN PATENT DOCUMENTS 0 511 139  10/1992  European Pat. Off. .

OTHER PUBLICATIONS

Hagenauer, J. and Papke, L., "Decoding 'Turbo'—Codes with the Soft Output Viterbi Algorithm (SOVA)," Proc. IEEE Int'l Symp. on Information Theory, Trondheim, Norway, p. 164, Jun. 1994.

Robertson, P., "Improving Decoder and Code Structure of Parallel Concatenated Recursive Systematic (Turbo) Codes," Proc. 3rd Ann. Int'l Conf. on Universal personal Communications, San Diego, CA, pp. 183–187, Sep. 1994.

Berrou, C. Combelles, P., Penard,P. and Talibart, B., "IC for Turbo–Codes Encoding and Decoding," Proc. 1995 IEEE Int'l Solid–State Circuits conf., pp. 90–91, Feb. 1995.

C. Berrou et al., "Turbo–Codes: General Principles and Applications", Audio and Video Digital Radio Broadcasting Systems and Techniques, 1993, pp. 215–226.

M. Moher, "Decoding via Cross–Entropy Minimization", Proceedings of Globecom '93, IEEE Global Telecommunications Conference, vol. 2, USA, pp. 809–813.

C. Berrou et al., "Near Shannon Limit Error–Correcting Coding and Decoding: Turbo–Codes (1)", Proc. ICC 1993, pp. 1064–1070.

P. Robertson, "Illuminating the Structure of Code and Decoder of Parallel Concatenated Recursive Systematic (Turbo) Codes", 1994, Globecom, IEEE Communications Society, pp. 1298–1303.

*Primary Examiner*—Stephen Chin
*Assistant Examiner*—Jeffrey W. Gluck
*Attorney, Agent, or Firm*—Hill & Simpson

[57] ABSTRACT

An adaptive abort criterion in iterative decoding of transmitted, multi-dimensionally encoded information employs the relative entropy, approximations of the relative entropy or quantities similar thereto as criterion for the change in the weighted decisions of successive iteration sub-steps. When an iteration sub-step does not produce a change of the relative entropy lying above a predetermined threshold, then the iterative decoding is aborted.

15 Claims, 1 Drawing Sheet

METHOD AND ARRANGEMENT FOR DETERMINING AN ADAPTIVE ABORT CRITERION IN ITERATIVE DECODING OF MULTI-DIMENSIONALLY CODED INFORMATION

BACKGROUND OF THE INVENTION

1. Field of the Invention

The present invention relates generally to a method and apparatus for aborting an iterative decoding process of encoded information after a number of iterations as determined by the present method.

2. Description of the Related Art

In data transmission, errors that are to be recognized and corrected at the data reception side occur in the transmission of information from a transmitter to a receiver on disturbed or noisy transmission channels. To that end, further, redundant check characters are transmitted in the channel coding in addition to the characters which represent the information.

In data channel coding, the encoder means at the transmitter side derives check characters from the characters representing the information on the basis of a corresponding coding scheme. The use of these check characters makes it possible at the receiver side to detect altered information characters and to potentially correct them. Variously configured encoding methods are available for channel coding. Included in the code group which can be employed are the parallel, chained, systematic recursive codes—"turbo codes"—disclosed by C. Berrou, in the publication "Near Shannon Limit Error-correcting and Decoding: Turbo-codes (1)", Proc. ICC '93, May 1993, and by C. Berrou and A. Glavieux, in the Publication "Turbo-codes: General Principles and Applications", as well as by R. de Gaudenzi and M. Luise (Ed.), in Audio and Video Digital Radio Broadcasting Systems and Techniques, Proc. of the 6th Tirrenia Int. Workshop on Digital Communications, pp.215–226, 1993.

Multi-dimensional codes are iteratively decoded at the information reception side. In the case of two systematic recursive codes, C. Berrou discloses an iterative decoding method in European Patent Application EP 92 460 011.7 without, however, discussing adaptive abort criteria. Adaptive abort criterion differs from iterative decoding which utilizes a predetermined, fixed number of iterations, in that adaptive abort criteria allows the number of iterations to be flexibly adapted to the progress of the decoding process. Statistical investigations show that the decoded check characters can often already be identified with high dependability after a few iterations. Further iterations contribute very little to the performance capability of the coding method.

M. Moher, in the publication "Decoding via Cross-Entropy Minimization", Proceedings of GLOBECOM '93, IEEE Global Telecommunications Conference, Vol.2, Houston, Tex., USA, 19 Nov.–2 Dec. 1993, pp.809–813, discloses a decoding method for decoding product codes that is based on an estimate of entropy, or measure of the loss of information in a transmitted message. The received channel information is compared to the code words which are determined from the parity equations (the parity bits and useful bits). The more similar the decoding result (the specific code words) is to the channel information, the better the decoding—the relative entropy is thereby minimal. The relative entropy thereby serves as optimization criterion for the decoding.

P. Robertson, in the publication "Illuminating the Structure of Code and Decoder for Parallel Concatenated Recursive Systematic (Turbo) Codes" submitted at GLOBECOM '94, discloses an adaptive abort criterion based on a comparison of the noise variance of the channel transmitting the information to a channel identified by a predetermined signal-to-noise ratio and, thus, an error rate. When the noise variance that is identified after an iteration step yields a value smaller than the predetermined value corresponding to a signal-to-noise ratio, then the iterative decoding process is aborted. An abort criterion is thus presented that is based on an estimate of the quality of the decoding and is merely founded on the empirical determination that the noise variance up to the iteration step which enables the complete error elimination is very high given highly error-laden character sequences. Further, the calculating outlay for determining this abort criterion is extremely high.

SUMMARY OF THE INVENTION

An object of the present invention is to provide a method and an arrangement for determining an adaptive abort criterion given iterative decoding of multi-dimensionally coded information that avoids the afore-mentioned disadvantages.

This and other objects and advantages are achieved according to the invention by a method for determining an adaptive abort criterion in the iterative decoding of multi-dimensionally coded information, whereby, following an iteration sub-step, a first weighted decision, the soft output, about the information to be decoded is compared to a second weighted decision that is acquired from a combination of sub-results of preceding iteration sub-steps which differs from the first weighted decision, and the iterative decoding is aborted dependent on the comparison result.

An arrangement for implementing the inventive method is provided by a decoder module providing determination of an adaptive abort criterion in the iterative decoding of multi-dimensionally coded information, comprising means for determining and storing weighted decisions after an iteration sub-step, means for comparing the weighted decisions, and means for initiating an abort of the iterative decoding dependent on the comparison result.

The special inventive aspect lies in the utilization of the information (the extrinsic information) that is additionally acquired during the process of the iterative decoding for the determination of the abort step of the decoding method. After each decoding step of one of the component codes of the multi-dimensional code, the weighted decision (which is the soft output) can be formed over each of the information characters to be decoded (particularly information bits given digital characters) as a sum of the extrinsic information from the respectively last decoding step of each and every component code of the channel information as well as of the potentially existing a priori information about the appertaining information bit. The determination of the approximate relative entropy from the weighted decisions of two sub-iterations that forms the basis of the proposed abort criterion can thus be initiated both after a sub-iteration step as well as after a complete iteration.

The method for determinating an adaptive abort criterion shall be explained in brief below on the basis of derivations of information theory. It is based essentially on an approximation of the relative entropy (cross entropy, relative entropy) $D(P\|Q)$ of two distributions P and Q that is a criterion for the difference of the distributions P and Q.

Let $L_P^{(i)}(\hat{u}_k)$ be the soft output over the decoded information bit $\hat{u}_k$ after the $i^{th}$ sub-iteration of the decoding of an n-dimensional "turbo" code that is composed in the following way:

$$L_P^{(i)}(\hat{u}_k) = L_{c_k} \cdot y_k + L(\hat{u}_k) + \sum_{j=1}^{n} L_{e_j}^{(i)}(\hat{u}_k). \quad (1)$$

$L_{c_k} \cdot y_k$ thereby references the channel information, $L(\hat{u}_k)$ references the a priori information and $L_{e_j}^{(i)}(\hat{u}_k)$ references the extrinsic information from the coding of the $j^{th}$ component code that is current at the point in time i. Let $L_P^{(i)}(\hat{u}_k)$ characterize the binary distribution $P_k^{(i)}$. The distribution $Q_k^{(i)}$ is then characterized by the L-value $L_Q^{(i)}(\hat{u}_k)$ that differs from $L_P^{(i)}(\hat{u}_k)$ in that at least one summand derives from the sum over the n extrinsic information from a preceding sub-iteration $\xi(\xi<i)$.

Under the conditions that $\text{sign}(L_P^{(i)}(\hat{u}_k))=\text{sign}(L_Q^{(i)}(\hat{u}_k))$, $|L_P^{(i)}(\hat{u}_k)|>>1$, $|L_Q^{(i)}(\hat{u}_k)|>>1$, $|L_P^{(i)}(\hat{u}_k)|>|L_Q^{(i)}(\hat{u}_k)|$ and $|L_P^{(i)}(\hat{u}_k)-L_Q^{2}(\hat{u}_k)|<<1$ then the equation $$\tilde{D}(P_k^{(i)} \| Q_k^{(i)}) = e^{-L_Q^{(i)}(\hat{u}_k)} \cdot |L_P^{(i)}(\hat{u}_k) - L_Q^{(i)}(\hat{u}_k)|^2 \quad (2)$$

approximately corresponds to the cross entropy of the distributions $P_k^{(i)}$ and $Q_k^{(i)}$.

When the statistical independence of the individual decisions is also assumed, then the equation $$\tilde{D}(P^{(i)} \| Q^{(i)}) = \sum_{(k)} \tilde{D}(P_k^{(i)} \| U_k^{(i)}) \quad (3)$$

approximates the cross entropy $D(P\|Q)$ of the $i^{th}$ sub-iteration that, since $P^{(i)}$ is dependent on the L-values of the $i^{th}$ sub-iteration and $Q^{(i)}$, in addition to being dependent on the L-values of the $i^{th}$ sub-iteration, is also dependent on the L-values of at least one previous sub-iteration $\xi(\xi<i)$, is a criterion for the change in the decisions of two sub-iterations i and $\xi$.

Since the abort step of the iterative decoding after a sub-iteration i should ideally ensue exactly when further sub-iterations also effect no change in the result of the decoding, the abort criterion can be formulated as follows with the assistance of $\tilde{D}(P^{(i)}\|Q^{(i)})$. The iterative decoding can be aborted after the sub-iteration i when $$\tilde{D}(P^{(i)}\|Q^{(i)})<S. \quad (4)$$

The quality as well as the complexity of the decoding can be influenced by the selection of the threshold S.

The special advantage of this procedure is comprised that the additionally acquired information (the extrinsic information) are already generated by the known method, i.e., additional calculating events are eliminated.

According to an advantageous development of the inventive method, the comparison of the weighted decisions over the information bits is formed after completion of a complete iteration step upon involvement of the extrinsic information acquired from the decoding of all component codes of the multi-dimensional code. As a result thereof, the contribution of an iteration step is completely evaluated and integrated into the abort criterion.

The calculation of the approximation of the relative entropy can be undertaken by processing the extrinsic information, and the result can be compared to a threshold. When the relative entropy is lower than the threshold, the iterative decoding can be aborted. The proposed adaptive abort criterion encompasses all the methods that, instead of employing equation (4) in the abort criterion, employ other approximations of the cross entropy instead of $\tilde{D}(P^{(i)}\|Q^{(i)})$, the cross entropy itself or other quantities whose properties are similar to the cross entropy. Particularly included in the latter group are the quantities that mainly evaluate the difference in the results of the decoding of two or more different sub-iterations by difference formation of the soft output values or by difference formation of parts of the soft output values.

The determination of a threshold to which the relative entropy is compared represents a characteristic value that is selectable according to the type of service to which the transmitted information belongs. When the information is transmitted within predetermined frames, the threshold can be separately determined for each frame as an example of the flexibility of the present method.

It is within the scope of the present method that the abort criterion that has been determined can be combined with further, additional abort criteria. For example, this additional abort criterion can be a fixed number of iterations that marks a maximum decoding delay which can be tolerated.

Exemplary embodiments of the present method provide that the weighted decisions on which the comparison is based are formed from the components of the code corresponding to the dimension of the code, being formed after the completion of a complete iteration step. An additional improvement provides that the weighted decisions on which the comparison is based are employed for calculating a relative entropy; the relative entropy is compared to a threshold; and the iterative decoding is aborted when the relative entropy is smaller than the threshold. The decoding is aborted when the relative entropy is smaller than the threshold or the number of iterations already completed corresponds to a predetermined number. The threshold is variable dependent on the desired transmission quality and on the average decoding delay. In one embodiment, the information to be decoded is transmitted within a plurality of frames and the threshold is separately determined for each frame.

Instead of the relative entropy, approximations of the relative entropy may be employed. Also, other quantities whose properties are similar to the relative entropy or which are acquired by difference formation of the weighted decisions or parts thereof are employed for the weighted decisions instead of the relative entropy.

Tables with non-linearly quantized input and output values may be utilized for the determination of the relative entropy or approximations thereof Additional abort criteria may be involved in the decision about the abort of the iterative decoding.

The invention also provides a decoding module for performing the inventive method. The decoder module, providing determination of an adaptive abort criterion in the iterative decoding of multi-dimensionally coded information, includes means for determining and storing weighted decisions after an iteration sub-step, means for comparing the weighted decisions, and means for initiating an abort of the iterative decoding dependent on the comparison result. The means for determining and storing the weighted decisions are fashioned such that the first weighted decision is acquired from the current iteration step;

the second weighted decision is acquired from a combination of sub-results of preceding iteration sub-steps differing from the first weighted decision; and the means for comparing the weighted decisions are fashioned such that the relative entropy is determined from the weighted decisions, the relative entropy is compared to a threshold, and the iterative decoding is aborted by the means for initiating an abort of the iterative decoding when the relative entropy is smaller than the threshold.

Means for setting the threshold are provided, so that the threshold can be separately set for each frame for information transmitted in frames. The means for initiating the abort of the iterative decoding dependent on the comparison result likewise effect the abort of the iterative decoding after a maximum number of iterations determined by the setting means.

BRIEF DESCRIPTION OF THE DRAWINGS

The present invention shall be described in greater detail with reference to an exemplary embodiment which is shown in the drawings.

DETAILED DESCRIPTION OF THE PREFERRED EMBODIMENTS

Figure 1:
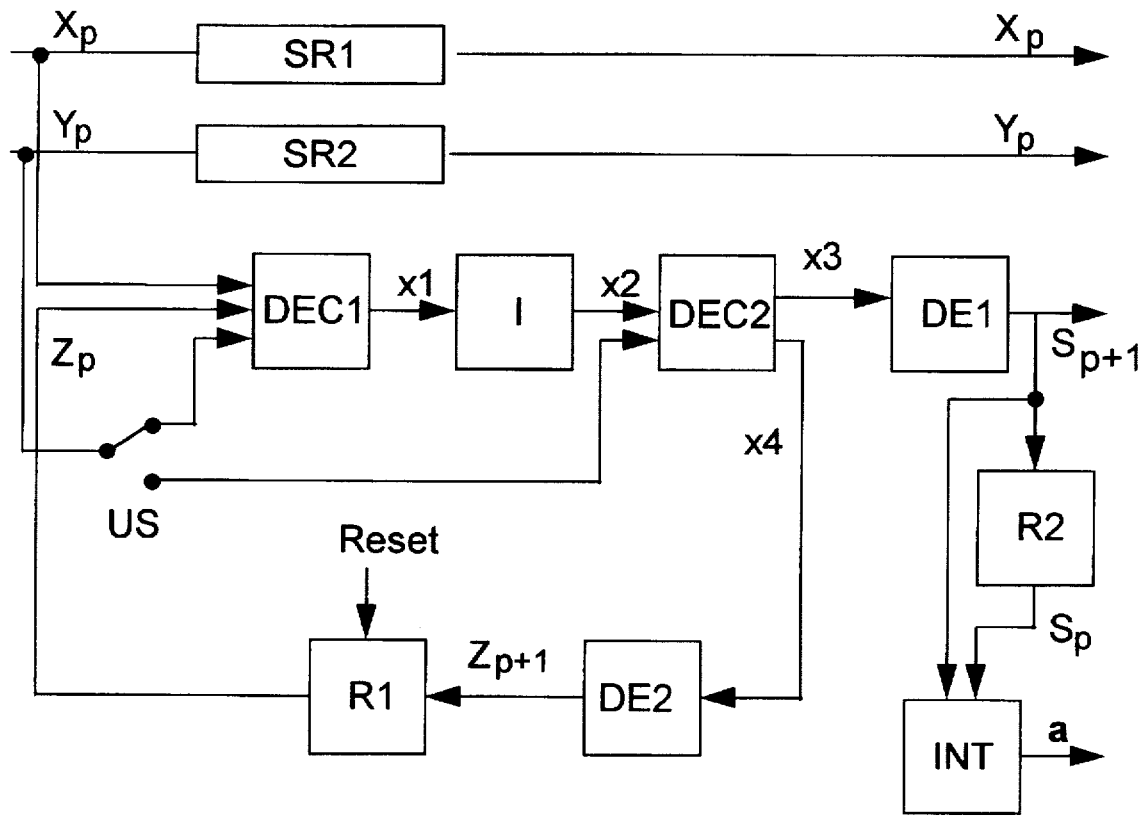
FIG. 1 is a block circuit diagram of a decoder module according to the present method.

The decoder module in FIG. 1 effects an iteration step for the purpose of iterative decoding of received information. In the selected example, a feedback of an extrinsic information $Z_p$ generated in the decoding ensues (the decoding process uses a feedback method). However, it is also possible to connect a plurality of such decoder modules to one another (which results in decoding by a pipeline method).

The module has three inputs for the characters $X_p$ representing the information, the check characters corresponding to the channel coding $Y_p$ and the information $Z_p$ generated in the last iteration step. The decoder module has five outputs, whereby the characters $X_p$ representing the information are delayed via the shift register SR1 and the check characters $Y_p$ are delayed via the shift register SR2 and also wait at the outputs of the decoder module. The extrinsic information $Z_{p+}$, acquired by the current iteration step of the iterative decoding forms an output of and decoder module and is returned to the input via a first register R1; the output a supplies the abort decision and the output $S_{p+1}$ supplies a weighted decision about the transmitted information after the last iteration.

A first input of a first decoder DEC1 is connected to the input of the decoder module that carries the characters $X_p$ representing the information. An output of the first register R1 conducts the extrinsic information $Z_p$ acquired during the last iteration step to the first decoder DEC1 at a second input. This information $Z_p$ is set to a neutral value before the first iteration, being set thereto via a reset input Reset of the first register R1. A third input of the first decoder DEC1 is connected to the first contact of a two-stage switchover US. The switchover US is also connected to the input of the decoder module that carries the check characters $Y_p$.

An output of the first decoder DEC1 conducts a first intermediate information x1 that contains both the extrinsic information $Z_p$ of the decoding as well as the characters $X_p$ representing the information to an input of an interleaver I. In the interleaver I, the first intermediate information x1 is scrambled to form a second intermediate information x2.

An output of the interleaver I is connected to a first input of a second decoder DEC2, so that the second intermediate information x2 is present at the second decoder DEC2. A second input of the second decoder DEC2 is connected to a second contact of the switchover US. In the selected example, the switchover US switches two serially existing sequences of check characters $Y_p$ onto the two decoders DEC1 and DEC2 at the right time and potentially inserts neutral characters. Parallel lines can also certainly be selected, foregoing the switchover US for the check characters $Y_p$.

The second decoder DEC2 is connected, first, to an input of a first de-interleaver DE1 and, second, to an input of a second de-interleaver DE2. The first de-interleaver DE1 makes a signal $S_{p+1}$, which is the soft output of the iteration, available an the output. The output of the second de-interleaver DE2 processes a fourth intermediate information x4 representing the extrinsic information acquired by the current iteration step, this fourth intermediate information x4, after processing, being supplied to an input of the first register R1.

The soft output $S_{p+1}$ at the output of the first de-interleaver DE1 is applied both to an input of a second register R2 as well as to an input of a device INT. A second input of the device INT is connected to the output of the second register R2. A signal a representing the abort decision is provided at an output of the device INT that determines the abort, or halt, of the iterative decoding process.

The shift registers SR1 and SR2 delay the characters $X_p$ representing the information and the check characters $Y_p$ until the decisions made by the iteration step are present at the outputs of the decoder module. For example, the decoder module processes binary characters, whereby the characters $X_p$, $Y_p$ and $Z_p$ are available as bit sequences of n bits.

The first decoder DEC1 corresponds with the first encoder of the coder means. The decoding result of the first decoder DEC1, which is the first intermediate information x1, is supplied to the interleaver I that scrambles the bits within the character sequences according to an interleaver matrix. This scrambled character sequence is the second intermediate information x2 that is decoded in the second decoder DEC2 together with the corresponding part of the check character sequence $Y_p$. The second decoder DEC2 corresponds with the second encoder of the coder device that generates the appertaining part of the check character sequence $Y_p$. The second decoder DEC2 generates the third intermediate information x3 that, following the first de-interleaver DE1, corresponds to the soft output $S_{p+1}$ of the iteration. The first decoder DC1 and the second decoder DEC2 need not necessarily use the same decoding method. They must merely correspond to the appertaining coders of the encoder means.

The fourth intermediate information x4, which is likewise generated by the second decoder DEC2, is written into the first register R1 as the extrinsic information $Z_{p+1}$ of the current iteration step following a de-interleaving in the second de-interleaver DE2, so that it is available as extrinsic information $Z_p$ for the next iteration step. The soft output $S_{p+1}$, that is made available at the output of the second de-interleaver DE1 is written into the second register R2. The second register R2 is constructed and clocked such that the soft output signals $S_p$ and $S_{p+1}$ of two successive iteration steps are applied concurrently at the device INT for deciding about the abort. The abort signal a is generated by this device INT.

Figure 2:
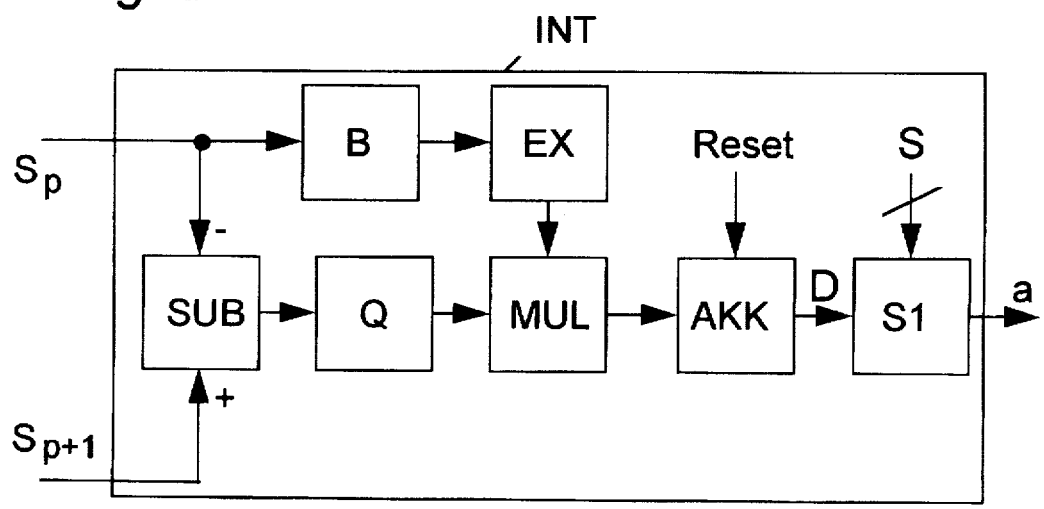
FIG. 2 is a block circuit diagram of the device within the decoder that effects an abort of the iterative decoding.

This device INT for determining the abort is described in greater detail below with reference to FIG. 2. A subtraction element SUB has its subtracting input connected to the soft output $S_p$ generated in the preceding iteration step and is connected via an adding input to the soft output $S_{p+1}$ generated in the current iteration step. An output of the subtraction element SUB from which the signal $S_{p+1}-S_p$ is output has a connection to a squarer Q that generates the square of the signal $(S_{p+1}-S_p)$. The signal $(S_{p+1}-S_p)^2$ is conducted to a multiplier element MUL. In this multiplier element MUL, the signal is multiplied with a signal that was generated by an amount formation of the soft output $S_{p+1}$ generated in the preceding iteration step in a means for amount formation B and by calculating an exponential function in a means for exponential formation EX. The squarer Q and the means for exponential function formation EX can be realized by corresponding calculating routines or by tables with non-linearly quantized input and output values. Accordingly, the multiplier element MUL can also be simplified.

The multiplication result is summed up in an accumulator AKK connected to the output of the multiplier element MUL. The relative entropy D of the current iteration is thus approximately present at the output of the accumulator AKK. The relative entropy D is thus approximated according to the equation:

$$D = e^{-|S_p|} \cdot |S_{p+1} - S_p|^2 \tag{5}$$

The summed-up relative entropy D is compared to a variable threshold S in a threshold switch S1 following the accumulator AKK. The accumulator AKK is reset after every iteration step, so that the relative entropy D of the last iteration step is compared to the threshold S in the decision about the abort of the iterative decoding. When the relative entropy D is smaller than the threshold S, an abort signal a is generated at an output of the threshold switch S1. This abort signal a is interpreted by the decoder module, and, following the abort of the decoding, the soft output $S_{p+1}$ after the last iterations made available to following modules, as is known.

Advantageously, a check to see whether the threshold S is exceeded can be carried out after each accumulation step. When this is the case, the calculation of the relative entropy D can be aborted. Other calculating methods of the abort signal a employing quantities similar to the relative entropy can also be utilized for the realization of the device INT regarding the determination of the abort of the iterative decoding.

Although other modifications and changes may be suggested by those skilled in the art, it is the intention of the inventors to embody within the patent warranted hereon all changes and modifications as reasonably and properly come within the scope of their contribution to the art.

We claim:

1. A method for determining an adaptive abort criterion in the iterative decoding of multi-dimensionally coded information, comprising the steps of:

performing an iteration sub-step of iterative decoding on information to be decoded, said iteration sub-step producing a soft output;

following said iteration sub-step, comparing a first weighted decision about the information to be decoded to a second weighted decision that is acquired from a combination of sub-results of preceding iteration sub-steps differing from the first weighted decision, said first weighted decision being based on said soft output, and aborting the iterative decoding dependent on the comparison result.

2. A method as claimed in claim 1, wherein said first and second weighted decisions on which said comparing step is based are formed from components of the code, each corresponding to a dimension of the code, being formed after completion of a complete iteration step.

3. A method as claimed in claim 1, further comprising the steps of:

calculating a relative entropy using said first and second weighted decisions;

comparing said relative entropy to a threshold; and aborting the iterative decoding when said relative entropy is smaller than said threshold.

4. A method as claimed in claim 3, further comprising the step of:

aborting the iterative decoding when a number of iterations already completed corresponds to a predetermined number if the iterative decoding is not already aborted by said relative entropy being smaller than said threshold.

5. A method as claimed in claim 3, further comprising the step of:

varying said threshold dependent on a predetermined transmission quality and on an average decoding delay.

6. A method as claimed in claim 3, wherein said information to be decoded is transmitted within a plurality of frames and further comprising the step of:

separately determining said threshold for each of said frames.

7. A method as claimed in claim 3, wherein said relative entropy is an approximation of the relative entropy.

8. A method as claimed in claim 3, wherein said relative entropy is a quantity whose properties are similar to the relative entropy, which quantity is used instead of the relative entropy.

9. A method as claimed in claim 3, wherein said relative entropy is a quantity which is acquired by forming a difference of at least parts of said weighted decisions, which quantity is used instead of the relative entropy.

10. A method as claimed in claim 3, further comprising the step of:

determining said relative entropy from tables with non-linearly quantized input and output values.

11. A method as claimed in claim 1, further comprising the step of:

utilizing additional abort criteria in a decision about aborting of the iterative decoding.

12. A decoder module for determination of an adaptive abort criterion in the iterative decoding of multi-dimensionally coded information, comprising:

means for determining and storing weighted decisions after an iteration sub-step, means for comparing said weighted decisions, and means for initiating an abort of the iterative decoding dependent on a comparison result by said means for comparing.

13. A decoder module as claimed in claim 12, wherein said means for determining and storing the weighted decisions include:

means for acquiring a first weighted decision from a current iteration step;

means for acquiring a second weighted decision from a combination of sub-results of preceding iteration sub-steps differing from said first weighted decision;

and wherein said means for comparing the weighted decisions include means for determining relative entropy from the weighted decisions, said relative entropy being compared to a threshold, and the iterative decoding being aborted by the means for initiating an abort of the iterative decoding when the relative entropy is smaller than the threshold.

14. A decoder module as claimed in claim 13, further comprising:

means for setting said threshold so that said threshold can be separately set for each frame for information transmitted in frames.

15. A decoder module as claimed in claim 13, wherein said means for initiating the abort of the iterative decoding dependent on the comparison result likewise effect the abort of the iterative decoding after a maximum plurality of iterations determined by setting means.

* * * * *